(12) United States Patent
Fan et al.

(10) Patent No.: US 9,929,248 B2
(45) Date of Patent: Mar. 27, 2018

(54) SOURCE/DRAIN REGIONS FOR HIGH ELECTRON MOBILITY TRANSISTORS (HEMT) AND METHODS OF FORMING SAME

(71) Applicant: Taiwan Semiconductor Manufacturing Company, Ltd., Hsin-Chu (TW)

(72) Inventors: Chun-Hsiang Fan, Hsin-Chu (TW); Chun-Hsiung Lin, Zhubei (TW); Mao-Lin Huang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/368,346

(22) Filed: Dec. 2, 2016

(65) Prior Publication Data
US 2017/0084717 A1    Mar. 23, 2017

Related U.S. Application Data

(62) Division of application No. 14/804,032, filed on Jul. 20, 2015, now Pat. No. 9,536,962.

(51) Int. Cl.
| | |
|---|---|
| *H01L 21/338* | (2006.01) |
| *H01L 29/66* | (2006.01) |
| *H01L 29/417* | (2006.01) |
| *H01L 29/205* | (2006.01) |
| *H01L 21/306* | (2006.01) |
| *H01L 29/08* | (2006.01) |
| *H01L 29/423* | (2006.01) |
| *H01L 29/267* | (2006.01) |
| *H01L 29/778* | (2006.01) |

(52) U.S. Cl.
CPC .. *H01L 29/66462* (2013.01); *H01L 21/30617* (2013.01); *H01L 29/0843* (2013.01); *H01L 29/0891* (2013.01); *H01L 29/205* (2013.01); *H01L 29/267* (2013.01); *H01L 29/41725* (2013.01); *H01L 29/42316* (2013.01); *H01L 29/7784* (2013.01)

(58) Field of Classification Search
CPC .......... H01L 29/66462; H01L 29/0843; H01L 29/267; H01L 29/7784
USPC ....................................................... 438/172
See application file for complete search history.

(56) References Cited

U.S. PATENT DOCUMENTS

| | | | |
|---|---|---|---|
| 5,504,353 | A | 4/1996 | Kuzuhara |
| 5,621,228 | A | 4/1997 | Ando |
| 6,172,384 | B1 | 1/2001 | Morikawa |
| 6,194,747 | B1 | 2/2001 | Onda |

(Continued)

FOREIGN PATENT DOCUMENTS

EP    1424734 A2    6/2004

*Primary Examiner* — Anthony Ho
(74) *Attorney, Agent, or Firm* — Slater Matsil, LLP

(57) ABSTRACT

An embodiment high electron mobility transistor (HEMT) includes a gate electrode over a semiconductor substrate and a multi-layer semiconductor cap over the semiconductor substrate and adjacent the gate electrode. The multi-layer semiconductor cap includes a first semiconductor layer and a second semiconductor layer comprising a different material than the first semiconductor layer. The first semiconductor layer is laterally spaced apart from the gate electrode by a first spacing, and the second semiconductor layer is spaced apart from the gate electrode by a second spacing greater than the first spacing.

20 Claims, 11 Drawing Sheets

(56) References Cited

U.S. PATENT DOCUMENTS

| | | |
|---|---|---|
| 6,620,662 B2 | 9/2003 | Hoke et al. |
| 6,720,200 B2 | 4/2004 | Yamaguchi et al. |
| 7,456,444 B2 | 11/2008 | Bito |
| 8,299,499 B2 | 10/2012 | Aoike et al. |

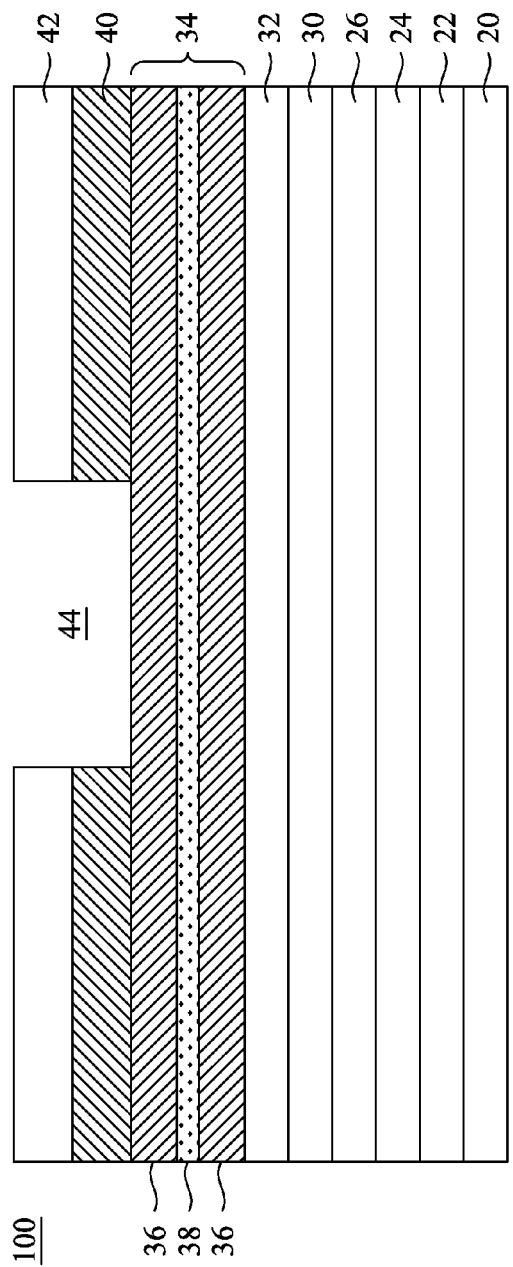
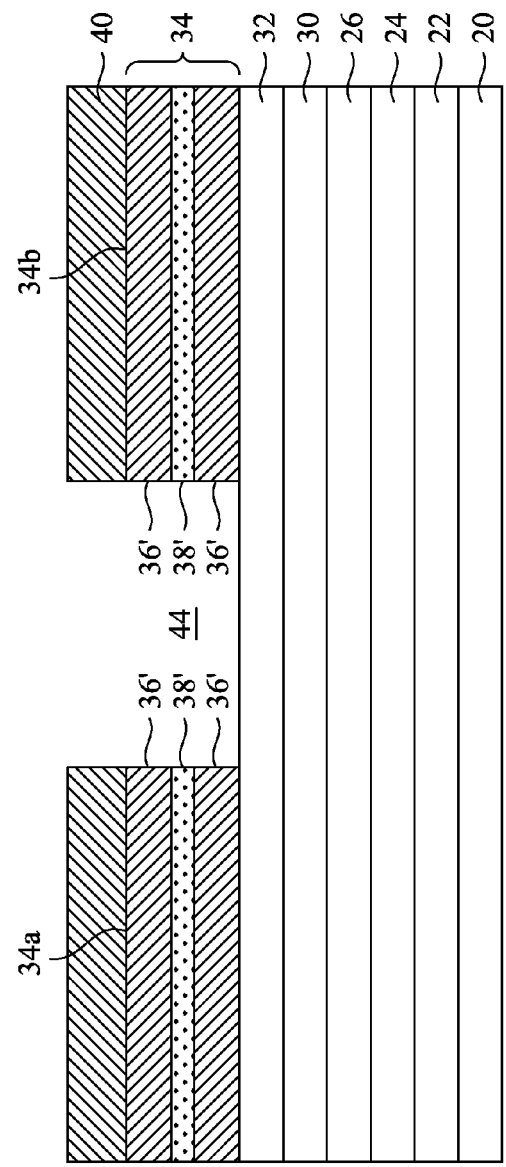

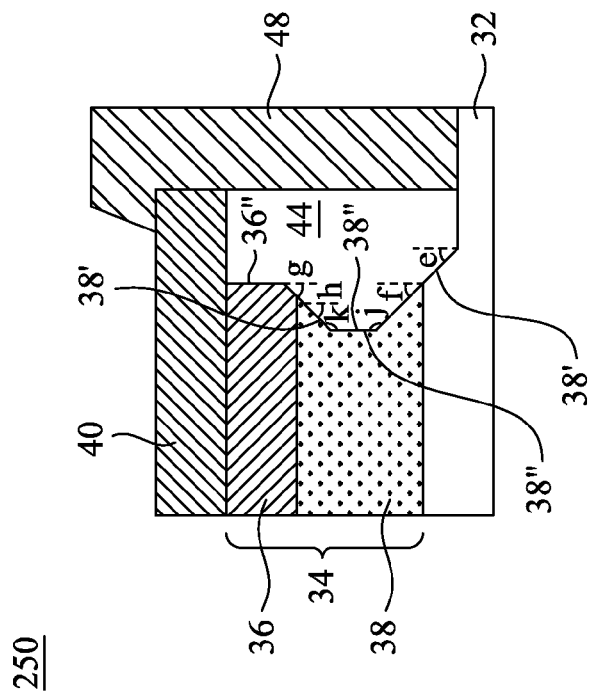
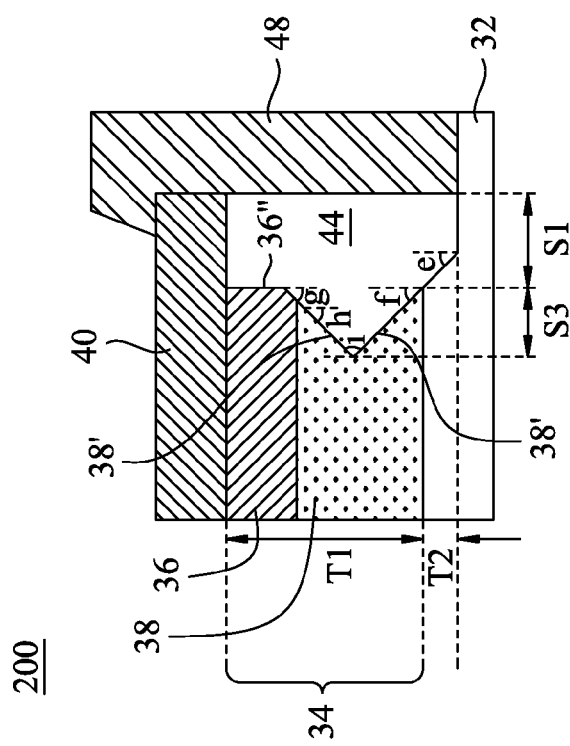
Fig. 14A
Fig. 14B

SOURCE/DRAIN REGIONS FOR HIGH ELECTRON MOBILITY TRANSISTORS (HEMT) AND METHODS OF FORMING SAME

PRIORITY CLAIM AND CROSS-REFERENCE

This application is a divisional of application Ser. No. 14/804,032, filed Jul. 20, 2015, entitled "Source/Drain Regions for High Electron Mobility Transistors (HEMT) and Methods of Forming Same," which application is hereby incorporated herein by reference.

BACKGROUND

In semiconductor technology, due to the high mobility values, Group III-Group V (or III-V) semiconductor compounds are used to form various integrated circuit devices, such as high power field-effect transistors, high frequency transistors, and High Electron Mobility Transistors (HEMTs). A HEMT is a field effect transistor incorporating a 2-Dimensional Electron Gas (2DEG) layer or a Two-Dimensional Hole Gas (2DHG) layer close to the junction between two materials with different band gaps (referred to as a heterojunction). The 2DEG layer, instead of a doped region as is generally the case for Metal Oxide Semiconductor Field Effect Transistors (MOSFETs), acts as the channel. In contrast with the MOSFETs, the HEMTs have a number of attractive properties including high electron mobility, the ability to transmit signals at high frequencies, and the like.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 11 illustrate cross-sectional views of various intermediary steps of forming a HEMT in accordance with some embodiments.

FIGS. 14A and 14B illustrate cross-sectional views of a portion of a HEMT in accordance with some other embodiments.

DETAILED DESCRIPTION

Figure 1:
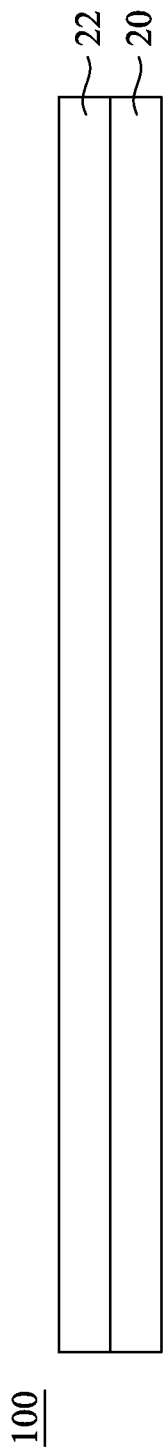

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments include source/drain regions of a high electron mobility transistor (HEMT). Each source/drain region includes a multi-layer semiconductor cap, which is disposed adjacent a gate stack of the HEMT. The multi-layer semiconductor cap includes at least a delta doped (δ-doped) layer and a high etch selectivity layer, which may be an undoped layer or a lightly doped layer. During formation of the HEMT, an etching process is applied to a sidewall the semiconductor cap to increase a distance between the δ-doped layer and the conductive gate, which advantageously reduces leakage current in the resulting device. The high selectivity layer includes a semiconductor material that can be etched at a lower rate than the δ-doped layer during this etching process. Thus, the high selectivity layer is disposed closer to the gate than the δ-doped layer after etching. Because at least a portion of the source/drain region can be disposed closer to the gate, resistance in the resulting HEMT is reduced, which advantageously improves the conductance ($G_m$) and on-state current ($I_{on}$) characteristics of the transistor without increasing leakage current.

FIGS. 1 through 11 illustrate the cross-sectional views of intermediary steps of manufacturing an HEMT 100 in accordance with some embodiments. Referring to FIG. 1, a cross-sectional view of a portion of substrate 20 is provided. Substrate 20 may be a part of larger wafer 10 (not illustrated). In some embodiments, substrate 20 includes a silicon (Si) substrate, an indium phosphide substrate (InP) substrate, a gallium arsenic (GaAs) substrate, or the like. Other semiconductor materials, such as III-V semiconductor materials, may also be used for substrate 20. Substrate 20 may be a bulk substrate formed of a bulk material, or may be a composite substrate including a plurality of layers that are formed of different materials (e.g., silicon on insulator substrate).

A barrier layer 22 is first formed over substrate 20, which acts as a buffer and/or the transition layer for the subsequently formed overlying layers (e.g., semiconductor layers 24 through 32, see FIG. 11). Barrier layer 22 may further provide insulation to reduce leakage current generated in the subsequently formed overlying layers from penetrating into underlying substrate 20. Barrier layer 22 may be epitaxially grown using metal-organic (MO) chemical vapor deposition (CVD), molecular beam epitaxy (MBE), liquid phase epitaxy (LPE), vapor phase epitaxy (VPE), MO VPE, selective epitaxial growth (SEG), combinations thereof, or the like. In some embodiments, barrier layer 22 comprises a high band gap ($E_g$) material, such as indium aluminum arsenic (InAlAs), aluminum arsenic (AlAs), and the like. In some embodiments, barrier layer 22 may further be used to adjust a band structure of HEMT 100.

Figure 2:
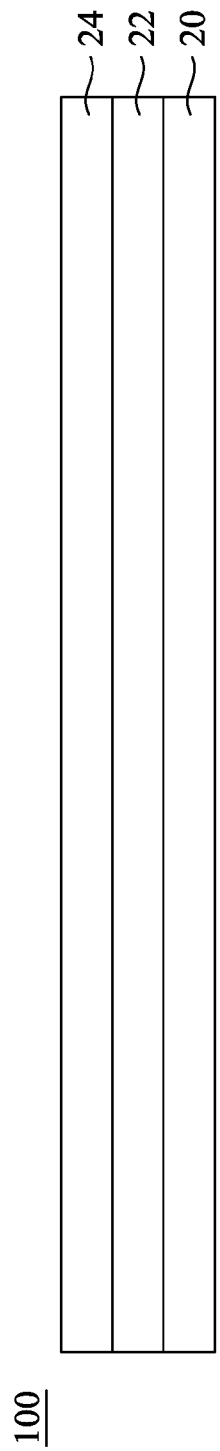

Referring to FIG. 2, a channel layer 24 is formed over barrier layer 22. In some embodiments, channel layer 24 comprises a III-V compound, such as, indium gallium arsenic (InGaAs), indium arsenic (InAs), indium antimonide (InSb), indium phosphide (InP), and the like. Other high mobility semiconductor materials may also be used. Channel layer 24 may be epitaxially grown by using, for example, MO CVD, MBE, LPE, VPE, MO VPE, SEG, combinations thereof, or the like, during which suitable precursor(s) are used. In various embodiments, channel layer 24 may be undoped. In another embodiment, channel layer 24 is unintentionally doped, such as lightly doped with n-type dopants due to a precursor used for forming channel layer 24, with no dopant that may cause III-V compound layer 24 to be n-type or p-type intentionally added.

Figure 3:
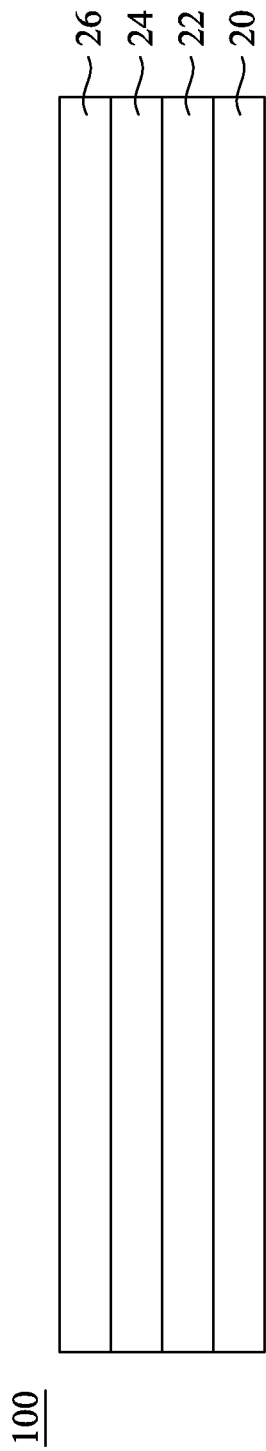

Referring to FIG. 3, a spacer layer 26 is grown on, and may contact, channel layer 24. In some embodiments, spacer layer 26 comprises a III-V compound, such as, indium gallium arsenic (InGaAs), indium phosphide (InP), indium aluminum arsenic (InAlAs), and the like. Other high mobility semiconductor materials may also be used. Spacer layer 26 may be epitaxially grown by using, for example, MO CVD, MBE, LPE, VPE, MO VPE, SEG, combinations thereof, or the like, during which suitable precursor(s) are used. Spacer layer 26 may be used as an isolation layer for channel layer 24 to prevent a short between channel layer 24 and subsequently formed upper layers of HEMT 100 (e.g., doped layer 30, see FIG. 4). As such spacer layer 26 may be an undoped layer in some embodiments. Spacer layer 26 may further reduce a band-to-band tunneling effect in the resulting HEMT.

Figure 4:
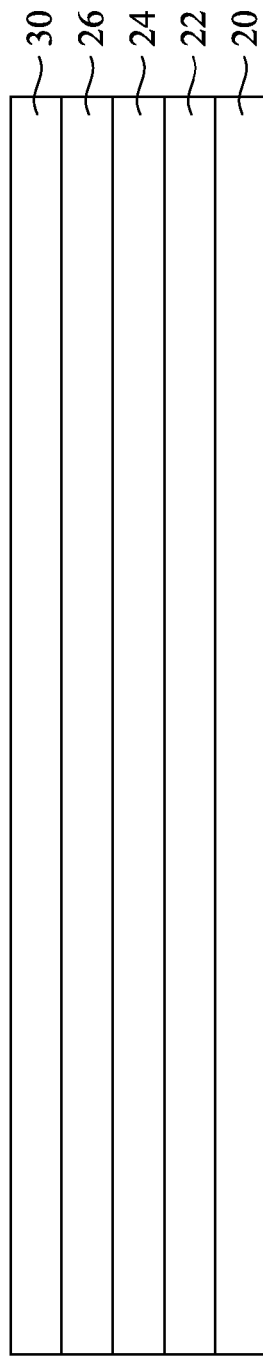

In FIG. 4, a doped layer 3o is formed over spacer layer 26. In some embodiments, doped layer 30 comprises a semiconductor compound, such as, a silicon monolayer, silicon-doped indium aluminum arsenic (InAlAs), silicon-doped indium phosphide (InP), silicon-doped gallium arsenic (GaAs), and the like. Doped layer 30 is used to tune a band structure and fermi-level position of HEMT 100. In an embodiment, doped layer 30 is a thin layer, which is doped with a suitable concentration of dopants (e.g., silicon). For example, in an embodiment, doped layer 30 is a monolayer of silicon. In some embodiments, doped layer 30 has a dopant concentration greater than about $1 \times 10^{19}/cm^3$. Spacer layer 26 (an undoped layer) is disposed between doped layer 30 and channel layer 24 to prevent an electrical short. Doped layer 30 may be epitaxially grown by using, for example, MO CVD, MBE, LPE, VPE, MO VPE, SEG, combinations thereof, or the like, during which suitable precursor(s) are used.

Figure 5:
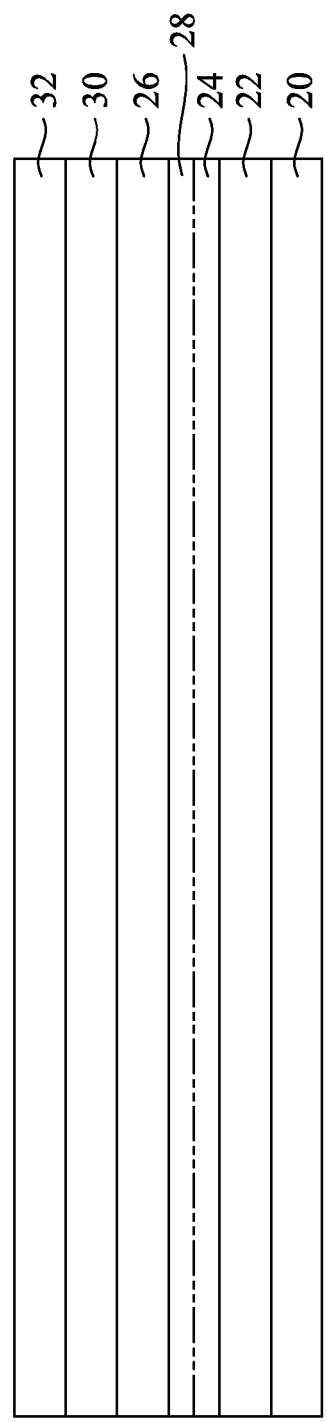

Referring next to FIG. 5, an upper barrier layer 32 is grown over doped layer 30. Upper barrier layer 32 may be epitaxially grown by using, for example, MO CVD, MBE, LPE, VPE, MO VPE, SEG, combinations thereof, or the like, during which suitable precursor(s) are used. Upper barrier layer 32 may be used to isolate a gate and channel of HEMT 100. In some embodiments, upper barrier layer 32 comprises a high Schottky barrier material. Furthermore, in some embodiments, upper barrier layer 32 comprises a III-V compound having a higher $E_g$ than channel layer 24, and upper barrier layer 32 is used to adjust a band structure of HEMT 100. In such embodiments, upper barrier layer 32 generates a quantum well with underlying channel layer 24. When HEMT 100 is operated, carrier channel 28, which is known as a Two-Dimensional Electron Gas (2DEG) or a Two-Dimensional Hole Gas (2DHG), is formed and located in an upper portion of channel layer 24 near spacer layer 26.

In some embodiments, upper barrier layer 32, channel layer 24, and barrier layer 22 may be used to create a composite channel (e.g., a sandwich channel). In an embodiment, upper barrier layer 32, channel layer 24, and barrier layer 22 may each comprise InGaAs having different atomic percentages of various elements. For example, barrier layers 32 and 22 may comprise about 53% indium and about 47% gallium while channel layer 24 may comprise about 70% indium and about 30% gallium. In another embodiment, barrier layers 32 and 22 may comprise indium gallium arsenic (e.g., having about 70% indium and about 30% gallium) while channel layer 24 comprises indium arsenic (e.g., having about 0% gallium). Other III-V compounds having different atomic percentages of various elements may also be used.

In some embodiments, upper barrier layer 32 and channel layer 24 may be used to create a composite channel (e.g., a bi-layer channel). In an embodiment, upper barrier layer 32 and channel layer 24 may each comprise InGaAs having different atomic percentages of various elements. For example, barrier layer 32 may comprise about 53% indium and about 47% gallium while channel layer 24 may comprise about 70% indium and about 30% gallium. In another embodiment, barrier layer 32 may comprise indium phosphide while channel layer 24 may comprise indium gallium arsenic (e.g., having about 53% indium and about 47% gallium). In another embodiment, barrier layer 32 may comprise indium aluminum arsenic (InAlAs) while channel layer 24 may comprise indium gallium arsenic (InGaAs). Other III-V compounds having different atomic percentages of various elements may also be used.

The composite channel of HEMT 100 is created due to band gap discontinuities between channel layer 24, upper barrier layer 32, and (optionally) barrier layer 22. These discontinuities create a very thin layer 28 of highly mobile conducting electrons in upper portions of channel layer 24. This thin layer 28 as a 2DEG or 2DHG. Layer 28 forms the carrier channel, which is the channel of HEMT 100. The carrier channel has high electron mobility partly because III-V compound layer 24 is undoped or unintentionally doped, and the electrons can move freely without collision or with substantially reduced collisions with impurities.

Figure 6:
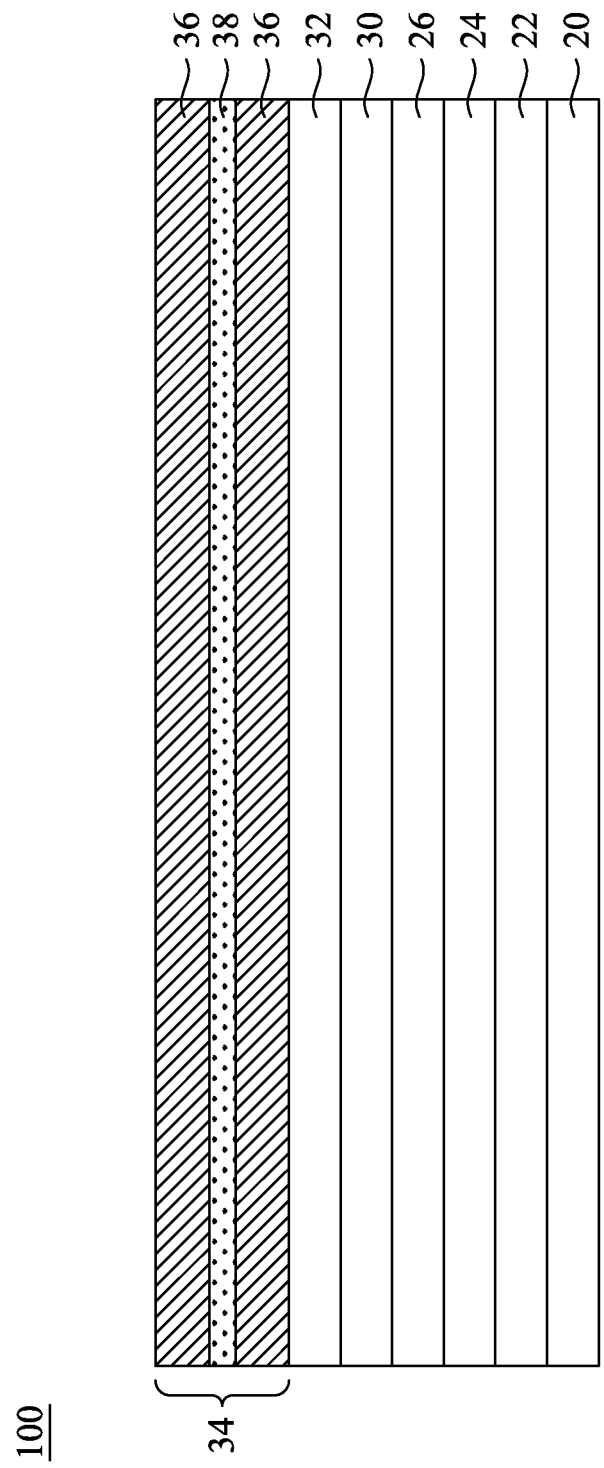

In FIG. 6, a multi-layer semiconductor cap 34 is formed over upper barrier layer 32. Multi-layer semiconductor cap 34 includes semiconductor layers 36 and a δ-doped layer 38, which may be disposed between top and bottom semiconductor layers 36. Each layer in the multi-layer semiconductor cap 34 may be epitaxially grown by using, for example, MO CVD, MBE, LPE, VPE, MO VPE, and the like, during which suitable precursor(s) are used. Furthermore, δ-doped layer 38 may be doped with n-type dopants of at a suitable concentration. For example, in an embodiment, δ-doped layer 38 may have a dopant concentration greater than about $1 \times 10^{19}/cm^3$.

Semiconductor cap 34 may be used to adjust a band structure of HEMT 100 as well as a diffusion barrier layer, for example. Thus the materials of multi-layer semiconductor cap 34 may be selected based on the materials of underlying upper barrier layer 32, channel layer 24, and barrier layer 22. Furthermore, the materials of semiconductor layers 36 and δ-doped layer 38 may be selected so that semiconductor layer 36 may be etched at a lower rate than δ-doped layer 38 during subsequent processing steps. In various embodiments, δ-doped layer 38 and semiconductor layers 36 comprise different materials. In some embodiments, semiconductor layers 36 may comprise gallium arsenic (GaAs), indium gallium arsenic (InGaAs), indium aluminum arsenic (InAlAs), indium phosphide (InP), germanium (Ge), silicon germanium (SiGe), and the like while δ-doped layer 38 may comprise indium aluminum arsenic (InAlAs), indium phosphide (InP), indium aluminum (InAl), indium gallium arsenic (InGaAs), gallium arsenic (GaAs), and the like. Various example combinations of semiconductor materials for layers 36 and 38 are provided in Table 1, below. Other semiconductor materials may be used in other embodiments. Thus, HEMT 100 includes a stack of various semiconductor layers. The specific layers described herein merely provide one example embodiment HEMT. Other embodiments may include any combination of the described layers, fewer layers, or additional layers.

In FIG. 7, a hard mask 40 and photoresist 42 are formed and patterned over semiconductor cap 34. Hard mask 40 may comprise one or more oxide (e.g., silicon oxide) and/or nitride (e.g., silicon nitride) layers to portions protect the underlying substrate 102 during patterning. Hard mask 40 may be blanket deposited over semiconductor cap 34 using any suitable deposition process, such as, atomic layer deposition (ALD), chemical vapor deposition (CVD), high density plasma CVD (HDP-CVD), physical vapor deposition (PVD), and the like.

After hard mask 40 is formed, photoresist 42 may be blanket deposited over hard mask. Photoresist 42 may then be patterned by exposing photoresist 42 to light (e.g., ultraviolet light) using a photomask (not shown). Exposed or unexposed portions of photoresist 42 may then be removed depending on whether a positive or negative resist is used to form an opening 44. The pattern of photoresist 42 (e.g., opening 44) is then transferred to hard mask 40 (e.g., using a suitable etching process). Thus, an opening 44 is patterned in photoresist 42 and hard mask 40. Opening 44 exposes a top surface of the semiconductor cap 34.

Subsequently, as illustrated in FIG. 8, opening 44 is patterned into the underlying semiconductor cap 34 using hard mask 40 as a patterning mask during an etching process. The etching of semiconductor cap 34 may include acceptable etch processes, such as a reactive ion etch (RIE), neutral beam etch (NBE), the like, or a combination thereof. The etching may be anisotropic. In some embodiments, photoresist 42 is consumed during the etching. In another embodiment, remaining portions of photoresist are removed in an ashing and/or wet strip processes, for example. In the resulting structure, opening 44 extends through semiconductor cap 34, and semiconductor layers 36 and δ-doped layer 38 includes sidewalls 36' and 38', respectively, disposed in opening 44. Furthermore, opening 44 divides semiconductor cap 34 into two physically separated areas 34a and 34b. Each area 34a and 34b may be part of a source or drain region of the resulting HEMT 100.

Figure 9:
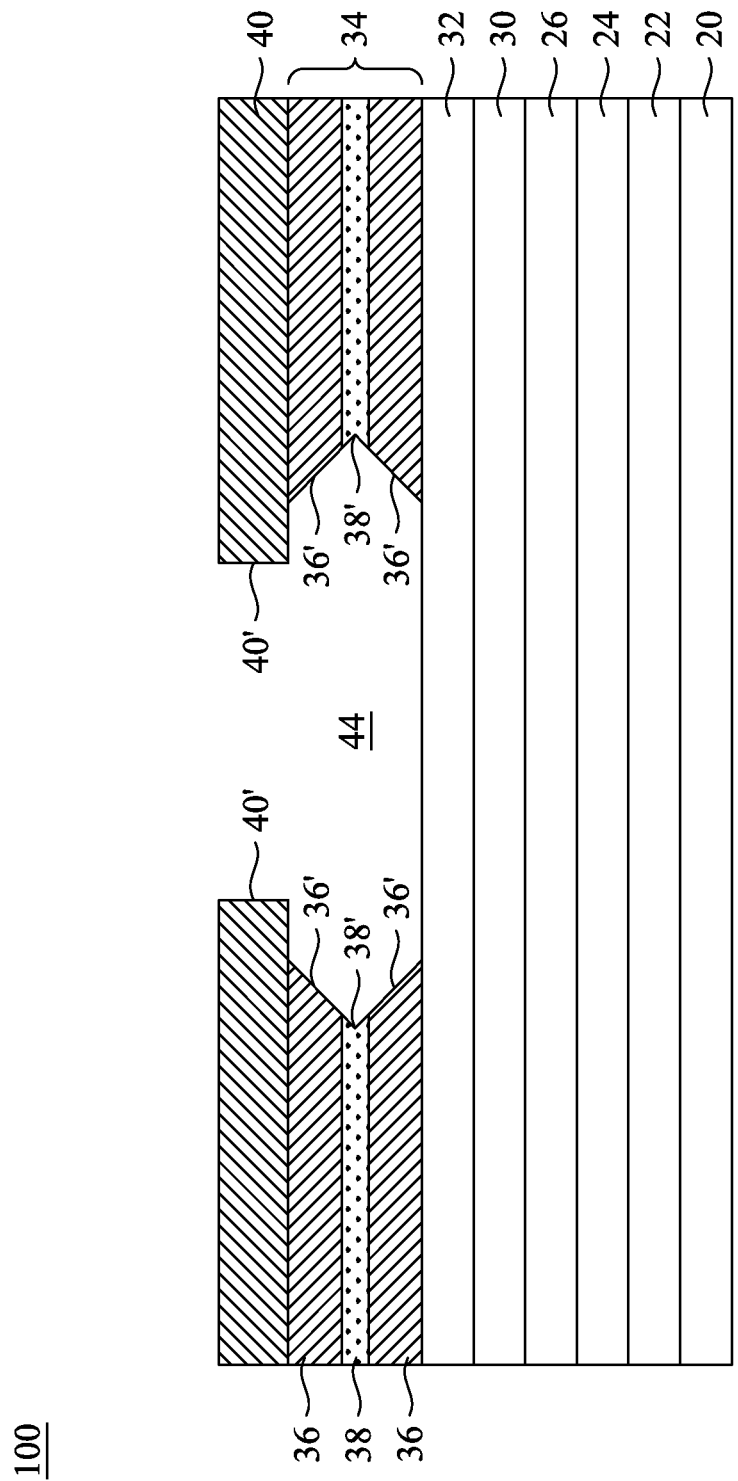

Referring next to FIG. 9, an additional etching process is performed to further etch sidewalls 36' and 38' of semiconductor layers 36 and δ-doped layer 38 in opening 44. The etching process may include a wet etch using chemical etchants that selectively etches δ-doped layer 38 at a faster rate than semiconductor layers 36. The etching may be an anisotropic process with orientation selectivity. Hard mask 40 protects a top surface of semiconductor cap 34 during the additional etching process. The chemical etchants used may vary depending on the materials of semiconductor layers 36 and δ-doped layer 38. Table 1 includes some example chemical etchants for various materials of semiconductor cap 34. Table 1 further illustrates example ratios of etching rates of semiconductor layer 36 versus semiconductor layer 38 using the materials and etchants listed. Other chemical etchants may also be used in other embodiments.

TABLE 1

Example Semiconductor Materials and Chemical Etchants

| Material of layer 36 | Material of layer 38 | Chemical Etchants | Etching rate ratio of layer 36 to layer 38 |
|---|---|---|---|
| InGaAs or GaAs | InAlAs | HCl:H$_2$O$_2$:DIW | 1.4 |
| InGaAs or GaAs | InP | HCl:DIW | 10 or greater |
| InGaAs or GaAs | InAs | HCl:DIW | 10 or greater |
| InAlAs | InGaAs or GaAs | NH$_4$OH:H$_2$O$_2$:DIW | 10 or greater |
| InP | InGaAs or GaAs | NH$_4$OH:H$_2$O$_2$:DIW | 10 or greater |
| InP | InAs | H$_2$SO$_4$:DIW | 10 or greater |
| Ge or SiGe | InP | HCl:DIW | 100 or greater |
| Ge or SiGe | InAs | HCl:DIW | 100 or greater |
| Ge or SiGe | InAs | H$_2$SO$_4$:DIW | 100 or greater |

In the resulting structure, δ-doped layer 38 is etched more than semiconductor layer 36. Thus, sidewalls 36' of semiconductor layers 36 and sidewalls 38' of δ-doped layer 38 are not aligned. Furthermore, sidewalls of semiconductor cap 34 (e.g., sidewalls 36' and sidewalls 38') are sloped, which form an angle shape having a vertex in δ-doped layer 38. For example, sidewalls 36' and sidewalls 38' are non-perpendicular to a major surface of underlying substrate 20. The exact profile of semiconductor layer 36 and δ-doped layer 38 may vary depending on the specific materials, chemical etchants, and thicknesses of these layers. Thus, other embodiments may include semiconductor layers 36 and 38 having a different profile.

Furthermore, in the illustrated embodiment, the chemical etchant may etch semiconductor layer 36 at a faster rate than hard mask. Thus, hard mask 40 may overhang and extend past sidewalls 36' and 38' in opening 44. In another embodiment, hard mask 40 may be etched a similar rate as semiconductor layer 36, and sidewalls 40' and 36' may be substantially aligned after etching. Sidewalls 40' of hard mask 40 may or may or may not be substantially perpendicular to a major surface of substrate 20.

Figure 10:
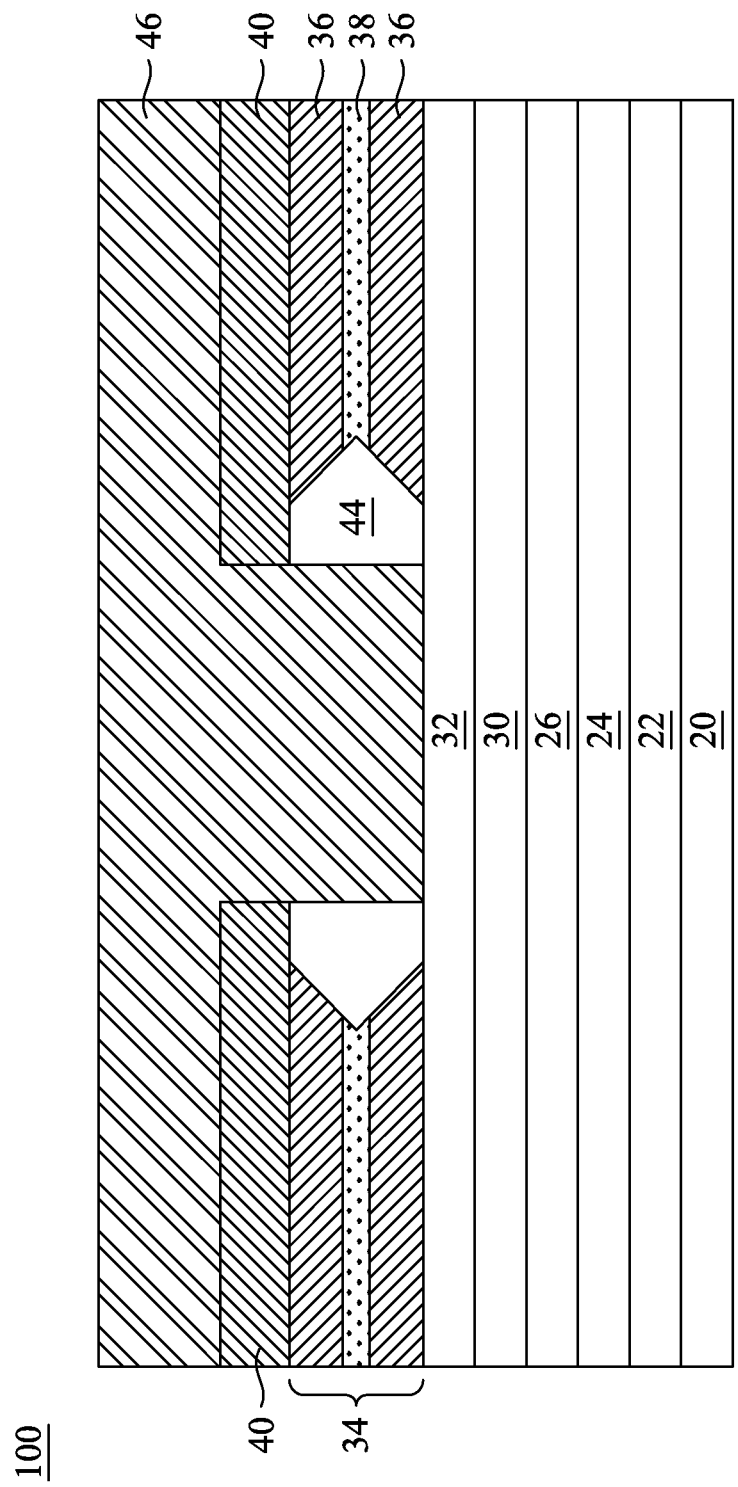

Next, in FIG. 10, a gate electrode layer 46 is formed over hard mask 40 and in opening 44. In some embodiments, gate electrode layer 46 is formed of tantalum or titanium containing materials such as TaC, TaN, TiN, TaAlN, TaSiN, and combinations thereof. These metal-containing materials may be in the form of metal carbides, metal nitrides, or conductive metal oxides. Other embodiments may utilize other types of metals, such as W, Cu, Ti, Ag, Al, TiAl, TiAlN, TaCN, TaSiN, Mn, WN, Ru, and Zr. The formation methods of the gate electrode include ALD, PVD, metal-organic chemical vapor deposition (MOCVD), and the like. The gate electrode layer 46 may further include two or more layers for a composite gate structure. Although FIG. 10 illustrate gate electrode layer 46 being formed directly on a top surface of upper barrier layer 32, various intermediary layers (e.g., a gate dielectric, interfacial layers, work/function metals, and the like) may be formed between gate electrode layer 46 and upper barrier layer 32. Sidewalls 36' and 38' of semiconductor layer 36 and δ-doped layer 38, respectively, face the gate electrode layer 46.

In the illustrated embodiments, at least a portion of the bottom surface of opening 44 is masked by hard mask 40 during the deposition of gate electrode layer 46. Therefore, gate electrode layer 46 may not be formed on these portions of opening 44. That is, portions of opening 44 are unfilled by gate electrode layer 46, and gate electrode layer 46 is separated from the materials of semiconductor cap 34 by a spacing. In another embodiment, hard mask 40 may not mask any portions of opening 44, and gate electrode layer 46 may cover an entire bottom surface of opening 44. In such embodiments, δ-doped layer 38 may still be separated from gate electrode layer 46 by a spacing due to the additional etching process performed on semiconductor cap 34 described above.

Figure 11:
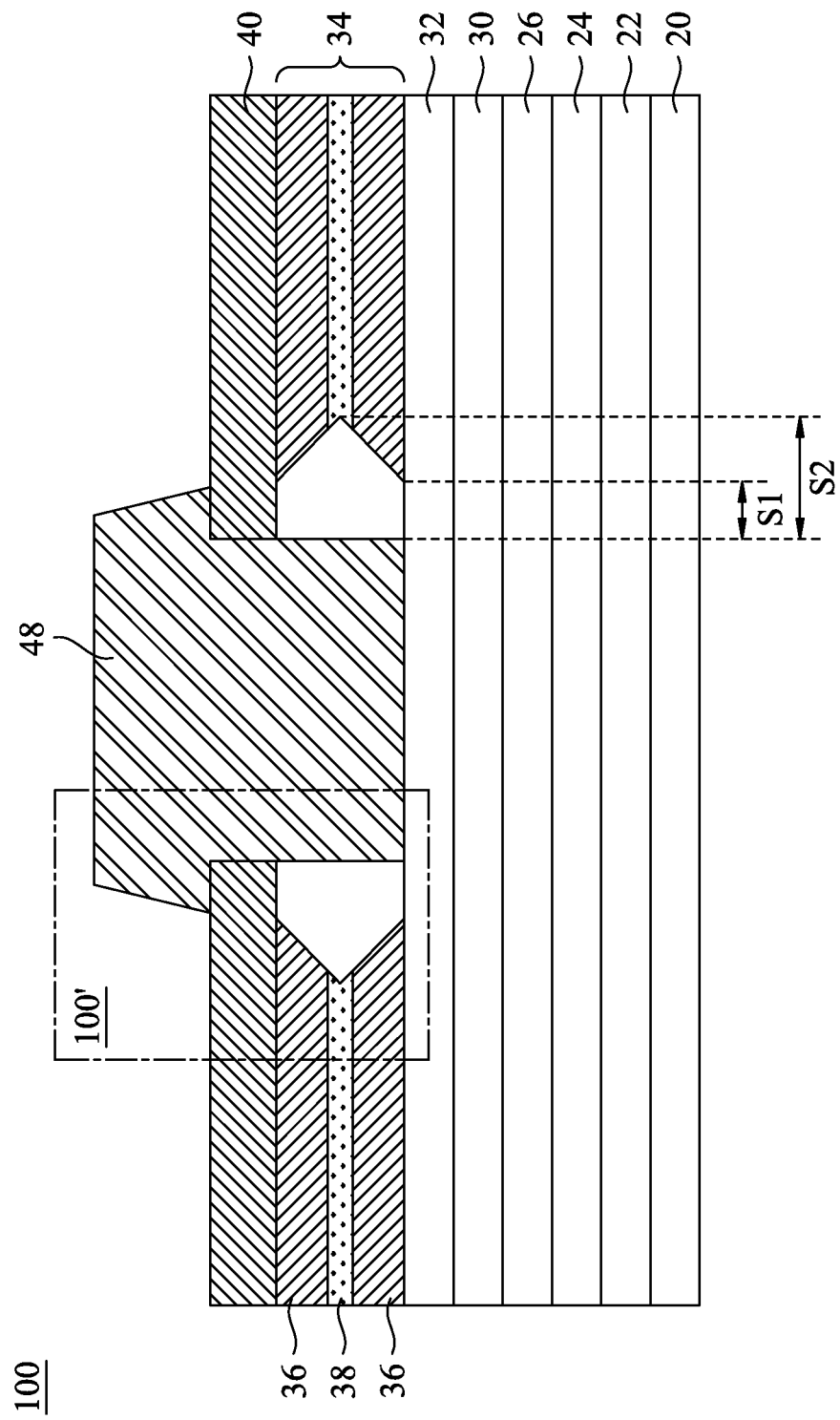

In FIG. 11, gate electrode layer 46 is patterned to form a t-shaped gate electrode 48. The patterning of gate electrode layer 46 may comprise any suitable process, such as a combination of photolithography and etching. Gate electrode 48 includes a portion extending through opening 44 and a portion extending over hard mask 40. Due to the additional etching process applied to semiconductor cap 34, semiconductor layer 36 and δ-doped layer 38 are spaced apart from gate electrode 48. In an embodiment, semiconductor layer 36 is spaced apart from gate electrode 48 by a first width S1 while δ-doped layer 38 is spaced apart from gate electrode 48 by a second width S2. In various embodiments, the differences in etching rates of semiconductor layer 36 and δ-doped layer 38 results in spacing S2 being greater than spacing S1. For example, spacing S1 may be about 50 nm or less while spacing S2 may be about 3 nm to about 100 nm.

In subsequent process steps, additional features (not shown) may be formed over HEMT 100. For example, an inter-layer dielectric (ILD) may be formed over gate electrode 48 and hard mask 40. The ILD may comprise a low-k dielectric material having a k-value less than about 4.0, for example. Source/drain and gate contacts may be formed to extend through the ILD. The source/drain contacts electrically connect to semiconductor cap 34 while the gate contact may electrically connect to gate electrode 48. In an embodiment, the source/drain contacts contact a top surface of semiconductor cap 34. In another embodiment, the source/drain contacts may contact another layer formed over semiconductor cap 34, such as additional semiconductor layers and/or silicide layers. Additional conductive features may then be subsequently formed in additional dielectric layers over HEMT 100 to form functional circuits.

It has been observed that by spacing a doped region (e.g., δ-doped layer 38) of semiconductor cap 34 away from gate electrode 48, leakage current in HEMT 100 may be reduced. Furthermore, differences in etching rates of various layers in semiconductor cap 34 allows for semiconductor layer 36 to be disposed closer to gate electrode 48 without reducing a distance between gate electrode 48 and δ-doped layer 38. Thus, resistance in HEMT 100 can be advantageously reduced without increasing leakage current. The lower resistance in HEMT 100 further improves its conductance ($G_m$) and on-state current ($I_{on}$) characteristics.

Figure 12A:
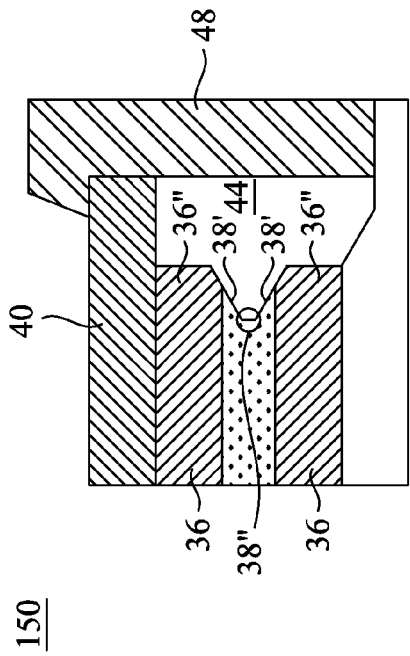
FIGS. 12A and 12B illustrate cross-sectional views of a portion of a HEMT in accordance with some embodiments.
Figure 12B:
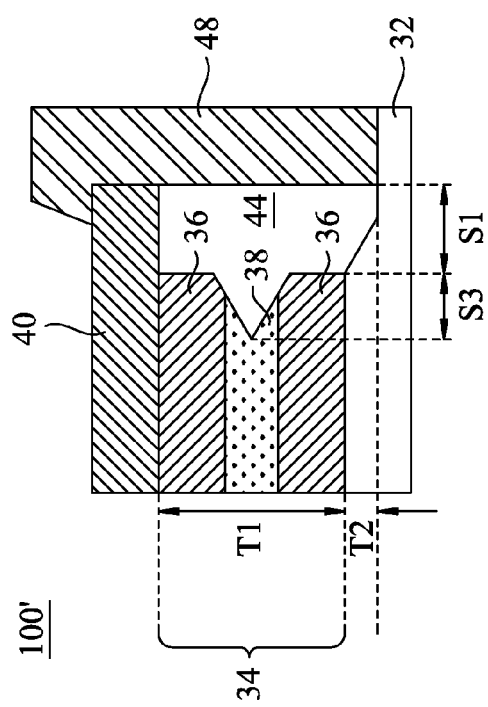

FIGS. 12A and 12B illustrate a detailed view of a portion 100' (see FIG. 11) of HEMT 100. As illustrated in FIG. 12A, semiconductor cap 34 is a tri-layer structure having a δ-doped layer 38 disposed between top and bottom semiconductor layers 36. Semiconductor cap 34 has a total thickness T1 of about 80 nm or less. A bottom surface of opening 44 may be recessed from a bottom surface of semiconductor cap 34 by a thickness T2. For example, an interface between semiconductor cap 34 and an underlying semiconductor layer (e.g., upper barrier layer 32) is higher than an interface between gate electrode 48 and the underlying semiconductor layer. This recessing can be a result, for example, of an etching process used to form opening 44 and/or an addition etching used to etch sidewalls of semiconductor cap 34 in opening 44. In an embodiment, thickness T2 may be about 100 nm or less. Each semiconductor layer 36 is spaced apart from gate electrode 48 by at least a spacing S1. In some embodiments, S1 may be about 50 nm or less. Furthermore, δ-doped layer 38 is spaced farther from gate electrode 48 than semiconductor layers 36. For example, a maximum spacing between δ-doped layer to a sidewall 36' of semiconductor layers 36 in opening 44 is designated as S3. In some embodiments spacing S3 is about 3 nm to about 50 nm. It has been observed that by configuring HEMT 100 to have these various dimensions, leakage current may be reduced while also reducing resistance. Furthermore, process windows for forming gate electrode 48 may be widened, which reduces manufacturing complexity.

FIG. 12B illustrates a detailed view of a profile for semiconductor cap 34 in HEMT 100. As illustrated, sidewalls of semiconductor cap 34 (e.g., sidewalls 36' and sidewalls 38') have sloped profiles while form an angle shape with a vertex in δ-doped layer 38. In various embodiments, an angle of the vertex (e.g., an angle at an intersection of top and bottom sidewalls 38') is designated as ∠i, which may be about 60° to about 130°, for example. Sidewalls 38' of δ-doped layer 38 are sloped and may be non-perpendicular with a major surface of underlying substrate 20. In some embodiments, angles ∠h and ∠f are defined by sidewall walls 38' and a line perpendicular to the major surface of substrate 20. In such embodiments, ∠h and ∠f may each be about 15° to about 90°. Sidewalls 36' of semiconductor layers 36 are sloped and non-perpendicular with a major surface of underlying substrate 20. In some embodiments, angles ∠g and ∠e are defined by sidewall walls 36' and a line perpendicular to the major surface of substrate 20 (see FIG. 11). In such embodiments, ∠g and ∠e may each be about 15° to about 90°.

Figure 13A:
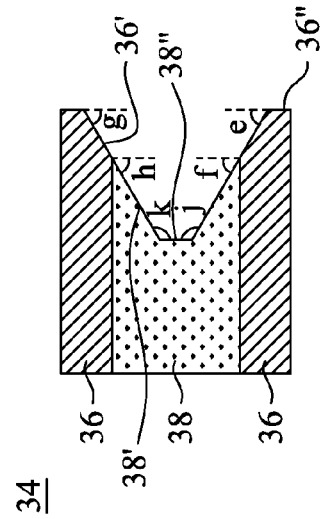
FIGS. 13A and 13B illustrate cross-sectional views of a portion of a HEMT in accordance with some other embodiments.
Figure 13B:
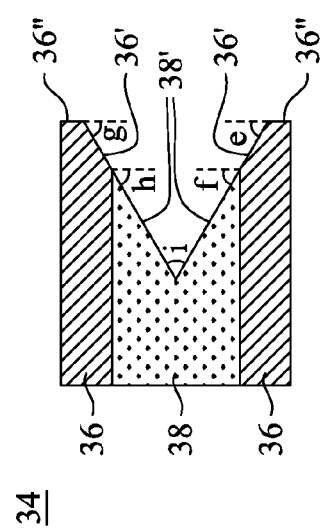

FIGS. 13A and 13B illustrate a detailed view of a portion of a HEMT iso in accordance with other embodiments. The portion of HEMT iso illustrated in FIGS. 13A and 13B may be similar to the portions of HEMT 100 illustrated in FIGS. 12A and 12B, respectively. HEMT 150 may be similar to HEMT 100 where like reference numerals indicate like elements. Furthermore, the dimensions and angles of various designated elements (e.g., thicknesses T1 and T2; spacings S1 and S2; and angles h, g, f, and e) may be similar to those discussed above. However, in HEMT 100, semiconductor cap 34 may have a different profile than that discussed above. In FIG. 13A, δ-doped layer 38 includes sloped sidewalls 38' as well as a sidewall 38", which is substantially perpendicular to a major surface of substrate 20 (see FIG. 11). In another embodiment, sidewall 38" may not be substantially perpendicular to the major surface of substrate 20. In such embodiments, sidewall 38" may be sloped at a different angle than sidewall 38'. Referring to FIG. 13B, in various embodiments, angles between sidewalls 38' and 38" are designated as ∠k and ∠j. In such embodiments, ∠k and ∠j may each be about 90° to about 160°, for example.

FIGS. 14A and 14B illustrate a detailed view of portions of HEMTs 200 and 250 in accordance with other embodiments. The portions of HEMTs 200 and 150 illustrated in FIGS. 14A and 14B may be similar to the portions of HEMT 100 illustrated in FIG. 12A. HEMTs 200 and 250 may be similar to HEMT 100 where like reference numerals indicate like elements. Furthermore, the dimensions and angles of various designated elements (e.g., thicknesses T1 and T2; spacings S1 and S2; and angles j, k, i, h, g, f, and e) may be similar to those discussed above. However, in HEMTs 200 and 250, semiconductor cap 34 is a bi-layer structure with a semiconductor layer 36 formed over δ-doped layer 38. A bottom surface of δ-doped layer 38 is a bottom surface of semiconductor cap 34. FIG. 14A illustrates an embodiment where δ-doped layer 38 comprises sloped sidewalls 38', which form an angle having a vertex in δ-doped layer 38. FIG. 14B illustrates an embodiment where δ-doped layer 38 comprises sloped sidewalls 38' as well as a sidewall 38", which is substantially perpendicular to a major surface of substrate 20 (see FIG. 11). In another embodiment, sidewall 38" may not be perpendicular to a major surface of substrate 20 (see FIG. 11), and sidewall 38" may be disposed at an angle different than sidewall 38'.

Figure 15A:
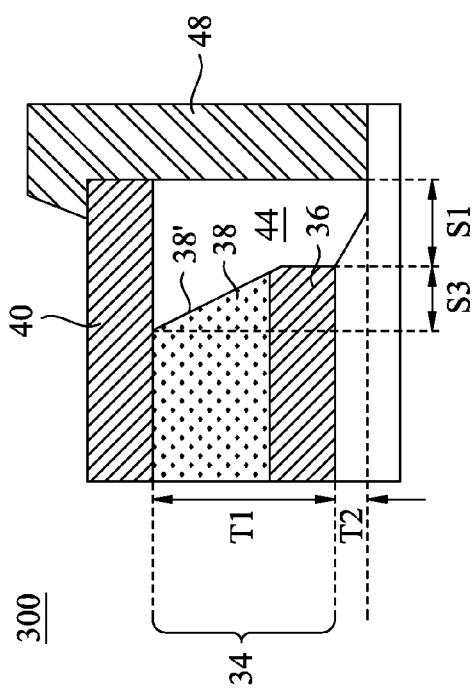
FIGS. 15A and 15B illustrate cross-sectional views of a portion of a HEMT in accordance with some other embodiments.
Figure 15B:
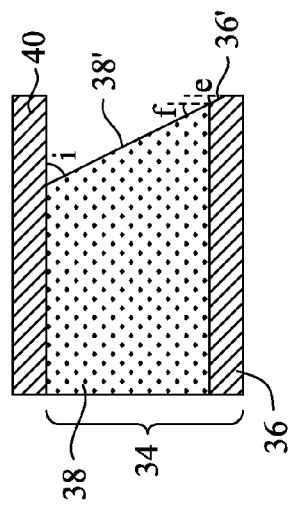

FIGS. 15A and 15B illustrate a detailed view of a portion of a HEMT 300 in accordance with other embodiments. The portion of HEMT 300 illustrated in FIGS. 15A and 15B may be similar to the portions of HEMT 100 illustrated in FIGS. 12A and 12B, respectively. HEMT 300 may be similar to HEMT 100 where like reference numerals indicate like elements. Furthermore, the dimensions and angles of various designated elements (e.g., thicknesses T1 and T2; spacings S1 and S2; and angle e and f) may be similar to those discussed above. However, in HEMT 300, semiconductor cap 34 is a bi-layer structure with δ-doped layer 38 formed over a semiconductor layer 36. A bottom surface of semiconductor layer 36 is a bottom surface of semiconductor cap 34. FIG. 15A illustrates an embodiment where δ-doped layer 38 comprises sloped sidewalls 38', which form an angle having a vertex in δ-doped layer 38. In various embodiments, an angle between a sloped sidewall 38' of δ-doped layer 38 and a bottom surface of hard mask 40 is designated as ∠l (see FIG. 15B). In such embodiments, ∠l may be about 20° to about 90°, for example.

Figure 16A:
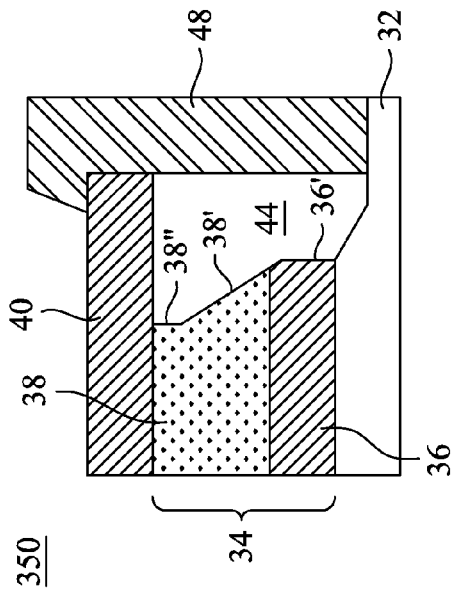
FIGS. 16A and 16B illustrate cross-sectional views of a portion of a HEMT in accordance with some other embodiments.
Figure 16B:
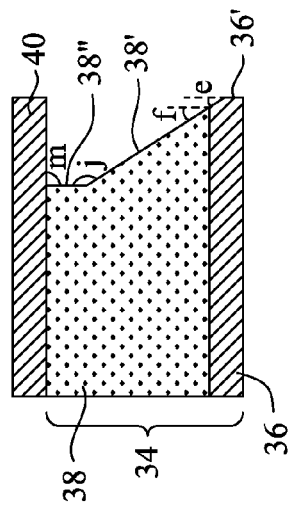

FIGS. 16A and 16B illustrate a detailed view of a portion of a HEMT 350 in accordance with other embodiments. The portion of HEMT 350 illustrated in FIGS. 16A and 16B may be similar to the portions of HEMT 300 illustrated in FIGS. 15A and 15B, respectively. HEMT 350 may be similar to HEMT 100 where like reference numerals indicate like elements. For example, in HEMT 350, semiconductor cap 34 is a bi-layer structure with δ-doped layer 38 formed over a semiconductor layer 36. Furthermore, the dimensions and angles of various designated elements (e.g., thicknesses T1 and T2; spacings S1 and S2; and angle e, f, and j) may be similar to those discussed above. However, as illustrated by FIG. 16B, in HEMT 350, δ-doped layer 38 comprises sloped sidewalls 38' as well as a sidewall 38", which is disposed at a different angle than sidewalls 38'. For example, sidewall 38" may be substantially perpendicular to a major surface of substrate 20 (see FIG. 11). In various embodiments, an angle between a sidewall 38" of δ-doped layer 38 and a bottom surface of hard mask 40 is designated as ∠m (see FIG. 16B). In such embodiments, ∠m may be about 90° to about 160°, for example.

Figure 17:
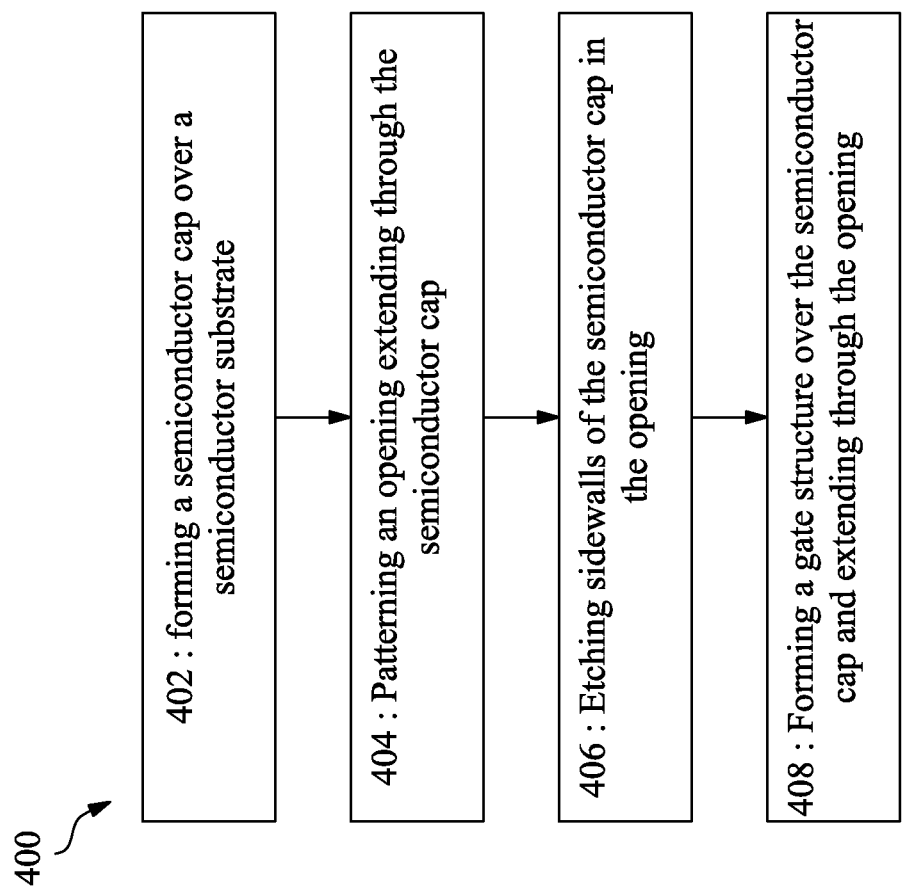
FIG. 17 illustrates an example process flow for forming a HEMT in accordance with some embodiments.

FIG. 17 illustrates an example process flow 400 for forming an HEMT in accordance with some embodiments. In step 402, a semiconductor cap (e.g., semiconductor cap 34) is formed over a semiconductor substrate (e.g., substrate 20). The semiconductor cap includes at least two semiconductor layers (e.g., semiconductor 36 and δ-doped layer 38) having different materials. In step 404, an opening (e.g., opening 44) is patterned extending through the semiconductor cap. In step 406, sidewalls of the semiconductor cap in the opening are etched. The etching may include using a chemical etchant that etches a first layer of the semiconductor cap (e.g., δ-doped layer 38) at a faster rate than a second layer of the semiconductor cap (e.g., semiconductor layer 36). Thus, in the resulting structure, the first layer may be etched more than the second layer. In step 408, after etching the sidewalls of the semiconductor cap, a gate structure (e.g., comprising gate electrode 46) is formed over the semiconductor cap and extending through the opening. The gate structure is separated from the semiconductor cap by at least a portion of the opening with the first layer being disposed farther away from the gate structure than the second layer.

As described above, embodiment HEMTs and methods of forming such HEMTs are discussed. The HEMTs includes a multi-layer semiconductor cap, which is part of source/drain regions disposed adjacent a gate stack of the HEMT. The multi-layer semiconductor cap includes at least a delta doped (δ-doped) layer and another semiconductor layer (e.g., a high etch selectivity layer), which may be an undoped layer or a lightly doped layer. During formation of the HEMT, an etching process is applied to a sidewall the semiconductor cap to increase a distance between the δ-doped layer and the conductive gate, which advantageously reduces leakage current in the resulting device. The semiconductor layer includes a semiconductor material that can be etched at a lower rate than the δ-doped layer during this etching process. Thus, the semiconductor layer is disposed closer to the gate than the δ-doped layer after etching. Because at least a portion of the source/drain region can be disposed closer to the gate, resistance in the resulting HEMT is reduced, which advantageously improves the conductance ($G_m$) and on-state current ($I_{on}$) characteristics of the transistor without increasing leakage current.

In accordance with an embodiment, a high electron mobility transistor (HEMT) includes a gate electrode over a semiconductor substrate and a multi-layer semiconductor cap over the semiconductor substrate and adjacent the gate electrode. The multi-layer semiconductor cap includes a first semiconductor layer and a second semiconductor layer comprising a different material than the first semiconductor layer. The first semiconductor layer is laterally spaced apart from the gate electrode by a first spacing, and the second semiconductor layer is spaced apart from the gate electrode by a second spacing greater than the first spacing.

In accordance with another embodiment, a high electron mobility transistor (HEMT) includes a gate structure over a semiconductor substrate, a source/drain region over the semiconductor substrate and adjacent the gate structure, and a hard mask over the source/drain region. The source/drain region comprises a semiconductor cap spaced apart from the gate structure, wherein the semiconductor cap includes one or more semiconductor layers and a doped semiconductor layer comprising a different material than the one or more semiconductor layers. The doped semiconductor layer has a first sidewall facing the gate structure, and at least a portion of the first sidewall is non-perpendicular to a major surface of the semiconductor substrate.

In accordance with yet another embodiment, a method for forming a high electron mobility transistor (HEMT) includes forming a semiconductor cap over a semiconductor substrate. The semiconductor cap includes first semiconductor layer and a second semiconductor layer having different material than the first semiconductor layer. The method further includes patterning an opening extending through the semiconductor cap and etching sidewalls of the semiconductor cap in the opening. Etching the sidewalls of the semiconductor cap comprises using a chemical etchant that etches the first semiconductor layer at a faster rate than the second semiconductor layer. After etching the sidewalls of the semiconductor cap, a gate structure is formed over the semiconductor cap and extending through the opening. The gate structure is spaced apart from the sidewalls of the semiconductor cap by a portion of the opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a high electron mobility transistor (HEMT) comprising:
    forming a semiconductor cap over a semiconductor substrate, wherein the semiconductor cap comprises:
        a first semiconductor layer; and
        a second semiconductor layer over the first semiconductor layer, wherein the second semiconductor layer comprises a different material than the first semiconductor layer;
    patterning an opening extending through the semiconductor cap;
    etching sidewalls of the semiconductor cap in the opening, wherein etching the sidewalls of the semiconductor cap comprises using a chemical etchant that etches the first semiconductor layer at a faster rate than the second semiconductor layer; and
    after etching the sidewalls of the semiconductor cap, forming a gate structure over the semiconductor cap and extending through the opening, wherein the gate structure is spaced apart from the sidewalls of the semiconductor cap by a portion of the opening.

2. The method of claim 1 further comprising forming a hard mask over the semiconductor cap, wherein the hard mask protects a top surface of the semiconductor cap while etching the sidewalls of the semiconductor cap.

3. The method of claim 2, wherein etching sidewalls of the semiconductor cap further comprises using the chemical etchant to etch the hard mask at a slower rate than the second semiconductor layer.

4. The method of claim 1, wherein after etching the sidewalls of the semiconductor cap, at least a portion of the sidewalls of the semiconductor cap is non-perpendicular to a major surface of the semiconductor substrate.

5. The method of claim 1, wherein the chemical etchant comprises:
    hydrogen chloride (HCl), hydrogen peroxide ($H_2O_2$), de-ionized water (DIW), or a combination thereof when the first semiconductor layer comprises indium aluminum arsenic (InAlAs), indium phosphide (InP), indium arsenic (InAs), or a combination thereof and the second semiconductor layer comprises indium gallium arsenic (InGaAs), gallium arsenic (GaAs), silicon germanium (SiGe), germanium (Ge), or a combination thereof;
    ammonium hydroxide ($NH_4OH$), hydrogen peroxide ($H_2O_2$), de-ionized water (DIW), or a combination thereof when the first semiconductor layer comprises indium gallium arsenic (InGaAs), gallium arsenic (GaAs), or a combination thereof and the second semiconductor layer comprises indium aluminum arsenic (InAlAs), indium phosphide (InP), or a combination thereof; and
    sulfuric acid ($H_2SO_4$), de-ionized water (DIW), or a combination thereof when the first semiconductor layer comprises indium arsenic (InAs) and the second semiconductor layer comprises indium phosphide (InP), silicon germanium (SiGe), germanium (Ge), or a combination thereof.

6. The method of claim 1, wherein first semiconductor layer is a doped layer with n-type or p-type dopants, and wherein the second semiconductor layer is a substantially undoped layer with n-type or p-type dopants.

7. The method of claim 1, wherein the semiconductor cap further comprises a third semiconductor layer comprising a different material than the first semiconductor layer, wherein the first semiconductor layer is disposed between the second semiconductor layer and the third semiconductor layer, and wherein etching the sidewalls of the semiconductor cap comprises using a chemical etchant that etches the first semiconductor layer at a faster rate than the third semiconductor layer.

8. A method for forming a high electron mobility transistor (HEMT), the method comprising:
    disposing a semiconductor cap over a substrate, wherein the semiconductor cap comprises:
        a first semiconductor material layer; and
        a second semiconductor material layer comprising a different material than the first semiconductor material layer;
    patterning the semiconductor cap to define a source/drain region, wherein the source/drain region comprises:
        a portion of the first semiconductor material layer; and
        a portion of the second semiconductor material layer, wherein a sidewall of the portion of the second semiconductor material layer is non-perpendicular to a major surface of the substrate;
    disposing a hard mask over the semiconductor cap while patterning the semiconductor cap to define the source/drain region; and
    forming a gate electrode adjacent the source/drain region, wherein a sidewall of the hard mask physically contacts a sidewall of the gate electrode.

9. The method of claim 8, wherein patterning the semiconductor cap comprises simultaneously etching the first semiconductor material layer and the second semiconductor material layer using a chemical etchant, wherein the chemical etchant etches the first semiconductor material layer at a slower rate than the second semiconductor material layer.

10. The method of claim 8, wherein forming the gate electrode comprises spacing the gate electrode at a first distance from the portion of the first semiconductor material layer and spacing the gate electrode at a second distance from the portion of the second semiconductor material layer, the first distance being less than the second distance.

11. The method of claim 8, wherein the hard mask overhangs the portion of the first semiconductor material layer and the portion of the second semiconductor material layer after patterning the semiconductor cap.

12. The method of claim 8, wherein the substrate comprises a channel and a barrier layer over the channel, wherein the semiconductor cap is disposed over the barrier layer, and wherein patterning the semiconductor cap comprises etching a top surface of the barrier layer.

13. The method of claim 8, wherein a sidewall of the portion of the first semiconductor material layer is non-perpendicular to the major surface of the substrate after patterning the semiconductor cap to define the source/drain region.

14. A method for forming a high electron mobility transistor (HEMT), the method comprising:
disposing a semiconductor cap over a substrate, wherein the semiconductor cap comprises:
a first semiconductor material layer;
a second semiconductor material layer comprising a different material than the first semiconductor material layer; and
a third semiconductor material layer comprising a different material than the first semiconductor material layer, wherein the first semiconductor material layer is disposed between the second semiconductor material layer and the third semiconductor material layer;
patterning the semiconductor cap to define a first source/drain region and a second source/drain region, wherein patterning the semiconductor cap comprises etching the semiconductor cap using an etchant, the etchant etching the first semiconductor material layer at a faster rate than the second semiconductor material layer; and
forming a gate electrode, wherein a portion of the gate electrode is disposed between the first source/drain region and the second source/drain region along a line parallel to a major surface of the substrate.

15. The method of claim 14, wherein the second semiconductor material layer is disposed over the first semiconductor material layer.

16. The method of claim 14, wherein the etchant comprises hydrogen chloride (HCl), hydrogen peroxide ($H_2O_2$), de-ionized water (DIW), or a combination thereof, wherein the first semiconductor material layer comprises indium aluminum arsenic (InAlAs), indium phosphide (InP), indium arsenic (InAs), or a combination thereof, and wherein the second semiconductor material layer comprises indium gallium arsenic (InGaAs), gallium arsenic (GaAs), silicon germanium (SiGe), germanium (Ge), or a combination thereof.

17. The method of claim 14, wherein the etchant comprises ammonium hydroxide ($NH_4OH$), hydrogen peroxide ($H_2O_2$), de-ionized water (DIW), or a combination thereof, wherein the first semiconductor material layer comprises indium gallium arsenic (InGaAs), gallium arsenic (GaAs), or a combination thereof, and wherein the second semiconductor material layer comprises indium aluminum arsenic (InAlAs), indium phosphide (InP), or a combination thereof.

18. The method of claim 14, wherein the etchant comprises sulfuric acid ($H_2SO_4$), de-ionized water (DIW), or a combination thereof, wherein the first semiconductor material layer comprises indium arsenic (InAs), and wherein the second semiconductor material layer comprises indium phosphide (InP), silicon germanium (SiGe), germanium (Ge), or a combination thereof.

19. The method of claim 14, wherein the second semiconductor material and the third semiconductor material have a same material composition.

20. The method of claim 14, wherein the etchant etches the first semiconductor material at a faster rate than the third semiconductor material.

* * * * *